United States Patent
Schillinger et al.

(10) Patent No.: US 9,661,775 B2
(45) Date of Patent: May 23, 2017

(54) WIRING DEVICE FOR WIRING AN ELECTRONIC APPARATUS

(71) Applicant: Continental Teves AG & Co. oHG, Frankfurt (DE)

(72) Inventors: Jakob Schillinger, Gaimersheim (DE); Dietmar Huber, Rödermark (DE); Lothar Biebricher, Oberursel (DE); Manfred Goll, Glauburg (DE); Matthias Viering, Mühltal (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 16 days.

(21) Appl. No.: 14/416,815

(22) PCT Filed: Jul. 30, 2013

(86) PCT No.: PCT/EP2013/066024
§ 371 (c)(1),
(2) Date: Jan. 23, 2015

(87) PCT Pub. No.: WO2014/020034
PCT Pub. Date: Feb. 6, 2014

(65) Prior Publication Data
US 2015/0189783 A1     Jul. 2, 2015

(30) Foreign Application Priority Data
Jul. 30, 2012   (DE) .......................... 10 2012 213 353

(51) Int. Cl.
*H01R 9/00*       (2006.01)
*H05K 7/02*       (2006.01)
(Continued)

(52) U.S. Cl.
CPC ........... *H05K 7/02* (2013.01); *G01C 19/5783* (2013.01); *G01P 1/023* (2013.01);
(Continued)

(58) Field of Classification Search
USPC .............................................. 361/772, 679.01
See application file for complete search history.

(56) References Cited

U.S. PATENT DOCUMENTS 5,925,927 A      7/1999  Orcutt
2004/0118227 A1  6/2004  Tokunaga
(Continued)

FOREIGN PATENT DOCUMENTS

DE   112005000168     11/2006
DE   102010005771      7/2011
(Continued)

OTHER PUBLICATIONS

International Search Report for International Application No. PCT/EP2013/066024 mailed Nov. 26, 2013.
(Continued)

*Primary Examiner* — Andargie M Aychillhum
(74) *Attorney, Agent, or Firm* — RatnerPrestia

(57) ABSTRACT

A wiring device for wiring an electronic apparatus including an interface, a conductor track and a component fitting island that is connected to the interface via the conductor track that is set up to carry an electronic component and to make electrical contact with the interface via the electrical conductor track, wherein the component fitting island is free of a web element that is set up to hold the component fitting island on a support element during a housing process housing the component fitting island.

11 Claims, 7 Drawing Sheets

(51) Int. Cl.
*H01L 23/31* (2006.01)
*H01L 23/495* (2006.01)
*G01P 1/02* (2006.01)
*H05K 5/00* (2006.01)
*H05K 3/30* (2006.01)
*G01C 19/5783* (2012.01)

(52) U.S. Cl.
CPC .... *H01L 23/3107* (2013.01); *H01L 23/49503* (2013.01); *H05K 3/30* (2013.01); *H05K 5/0078* (2013.01); *H01L 2224/48137* (2013.01); *H01L 2224/48247* (2013.01); *H01L 2924/1461* (2013.01); *Y10T 29/4913* (2015.01)

(56) References Cited

U.S. PATENT DOCUMENTS

| | | |
|---|---|---|
| 2005/0056920 A1 | 3/2005 | Li |
| 2005/0243567 A1* | 11/2005 | Bruchhage ............. F16H 63/42 362/489 |
| 2008/0013298 A1* | 1/2008 | Sharma ................ G01D 11/245 361/813 |
| 2009/0100911 A1 | 4/2009 | Kawanishi |
| 2011/0175598 A1* | 7/2011 | Doering ............ B29C 45/14655 324/160 |
| 2014/0288785 A1 | 9/2014 | Bretzigheimer |

FOREIGN PATENT DOCUMENTS

| | | |
|---|---|---|
| DE | 102011080789 | 2/2012 |
| JP | 5910244 | 1/1984 |
| JP | 6433955 | 2/1989 |
| JP | 025450 | 1/1990 |
| WO | 2010037810 | 4/2010 |

OTHER PUBLICATIONS

German Search Report for German Application No. 10 2013 214 915.8 mailed Nov. 15, 2013.
Written Opinion of the International Searching Authority for International Application No. PCT/EP2013/066024.

* cited by examiner

WIRING DEVICE FOR WIRING AN ELECTRONIC APPARATUS

CROSS REFERENCE TO RELATED APPLICATIONS

This application is the U.S. National Phase Application of PCT/EP2013/066024, filed Jul. 30, 2013, which claims priority to German Patent Application No. 10 2012 213 353.4, filed Jul. 30, 2012, the contents of such applications being incorporated by reference herein.

FIELD OF THE INVENTION

The invention relates to a wiring device for wiring an electronic apparatus, to the electronic apparatus and to a method for producing the electronic apparatus.

BACKGROUND OF THE INVENTION

WO 2010/037 810 A1, which is incorporated by reference, discloses an electronic apparatus in the form of a sensor for outputting an electrical signal on the basis of a detected physical variable. The sensor has a measurement circuit which is carried by a wiring device and is housed in a circuit housing.

SUMMARY OF THE INVENTION

An aspect of the invention consists in improving the known wiring device.

In accordance with one aspect of the invention, a wiring device for wiring an electronic apparatus comprises an interface, a conductor track and a placement island, which is connected to the interface via the conductor track and is designed to carry an electronic component and to make electrical contact with the interface via the electrical conductor track, wherein the placement island is free from a web element, which is designed to hold the placement island on a supporting element during a housing process for housing the placement island.

The specified wiring device is based on the consideration that, within the wiring device mentioned at the outset, the electrical conductor track and the placement island could be tied to a supporting element, referred to as a dambar, via at least one web element and to a transportation frame via a further web element. In this way, a stable mechanical design would be ensured. This would primarily be important for the production of fixed wire bonds when wiring the electronic component. The supporting element and the transportation frame are removed after production of the electronic apparatus, with the result only the placement island, the conductor track, the interface and the web element remain as the final wiring device.

Within the scope of the specified wiring device, however, it is identified that, when the wiring device mentioned at the outset is housed with the placed and wired electronic component in a circuit housing, the exit region for these web elements out of the circuit housing acts as entry zone for ions, moisture and therefore contamination.

The abovementioned problem is intensified if the wiring device mentioned at the outset is punched in an inexpensive manner. The force or stress during punching can act on the adhesion zone between the circuit housing and the web element and thus leads to detachment, referred to as delamination, of the circuit housing from the wiring device mentioned at the outset, in particular when the circuit housing is manufactured from a thermosetting plastic cast around the wiring device mentioned at the outset. The gap produced owing to the detachment can widen in the direction of the placement island and the wiring zones in the event of a change in temperature. Reactive ions can also be conducted along this gap, and these reactive ions can either result in corrosion, which brings about an interruption, or in migration, causing a short circuit, within the electronic apparatus with the wiring device mentioned at the outset.

For this reason, another path is taken with the specified wiring device. In this case, the web elements are at least not used in those regions in which the placement island and the electronic component are arranged. In this way, the abovementioned gap formation in the region of these elements would be made more difficult and the elements would be correspondingly protected from the abovementioned corrosion and migration.

In one development of the specified wiring device, the conductor track has a modulus of elasticity which is dimensioned such that bending of the conductor track once the electronic component has been placed on the placement island remains within a predetermined limitation. The development is based on the consideration that the placement island which is connected to the conductor track becomes a kind of cantilever. In the case of loading on the placement island, the conductor track would yield, deform and, beyond a certain degree, the wiring apparatus would become unusable for use in the electronic apparatus. For this reason, within the scope of the development it is proposed that the modulus of elasticity of at least the conductor track is selected such that bending of the conductor track owing to the lever loading remains within the predetermined limitation. This predetermined limitation can preferably be such that the abovementioned deformation is so small that the specified wiring device can be used in the electronic apparatus.

In an additional development, the specified wiring device comprises a leadframe enclosing the interface, the conductor track and the placement island. The specified wiring device can be produced as a mass-produced product with a band structure, wherein the leadframe separates the specified wiring device from a further wiring device.

In a particular development, the specified wiring device comprises the supporting element, which is connected to the leadframe via a further web element. Owing to the fact that the supporting element is tied to the leadframe, the stability of the wiring device can be further increased during production of the electronic apparatus and thus the risk of the abovementioned deformations can be reduced.

In a preferred development, the leadframe has a contour in its cross section which deviates from a sheet-shaped profile. This contour can be as desired, for example U-shaped, L-shaped or corrugated. Owing to the contour, the rigidity of the wiring device is increased, as a result of which the stability of the wiring device is further increased during production of the electronic apparatus and thus the risk of the abovementioned deformations can be reduced.

In accordance with a further aspect of the invention, an electronic apparatus comprises one of the specified wiring devices, an electronic element which is carried by the placement island of the wiring device and is in electrical contact with the interface of the wiring device via the electrical conductor track of the wiring device, and a circuit housing, which houses at least the placement island and the electronic element. In such an electronic apparatus, the risk of corrosion and migration, as already described further above, would be reduced, which results in a markedly longer life expectancy for the specified electronic apparatus.

In one development, the specified electronic apparatus comprises a molding compound which partially houses the circuit housing, wherein the circuit housing protrudes out of the molding compound at least in the region of the placement island. This region of the electronic apparatus no longer needs to be surrounded by molding compound because, in the specified electronic apparatus, there is no longer the risk of the ingress of moisture. In this way, savings can be made on molding compound material and the costs for the production of the specified electronic apparatus can be reduced.

In an additional development, the specified electronic apparatus is designed, as sensor, to output, with the circuit, an electrical signal based on a detected physical variable. In this case, the present invention is particularly effective since a measuring pickup, such as, for example, a temperature measuring pickup or a structure-borne noise measuring pickup is brought closer to the measurement field owing to the lack of molding compound and thus measurements can be performed with lower tolerances.

In accordance with a further aspect of the invention, a method for producing an electronic circuit comprises placing the electronic component on the placement island of one of the specified wiring devices and housing at least the placement island in a circuit housing.

In one development of the specified method, at least part of the wiring device is heated to a predetermined temperature during placement on the placement island. By virtue of the heating, the wiring device is brought to a temperature at which certain placement processes, such as, for example, the electrical connection by means of bonding wires, need to be performed more easily and with less mechanical forces. In this way, the abovementioned risk of deformation can be further reduced.

BRIEF DESCRIPTION OF THE DRAWINGS

The above-described properties, features and advantages of this invention and the way in which they are achieved will become clearer and more easily comprehensible in connection with the following description of the exemplary embodiments, which will be explained in more detail in connection with the drawings, in which.

DETAILED DESCRIPTION OF THE PREFERRED EMBODIMENTS

Identical technical elements have been provided with identical reference symbols and described only once in the figures.

Figure 1:
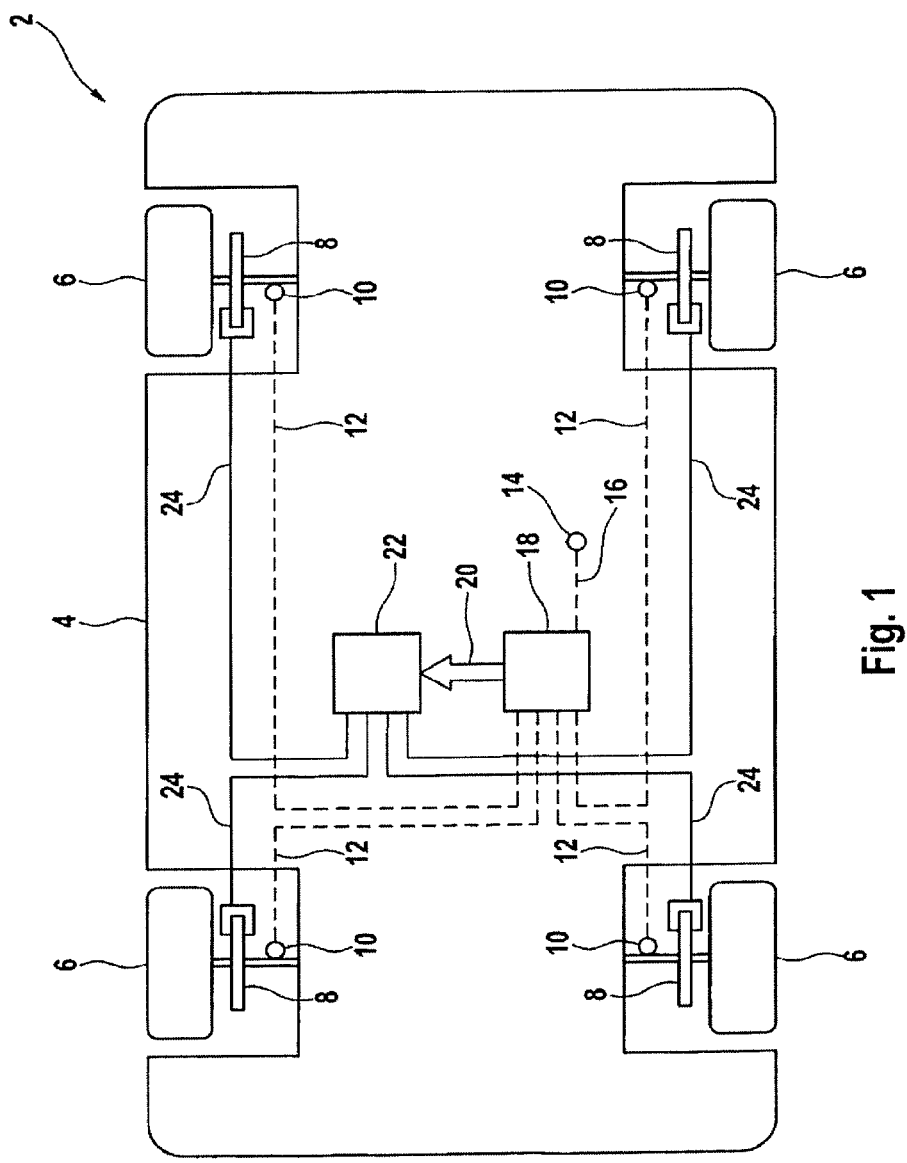
FIG. 1 shows a schematic view of a vehicle with driving dynamics regulation.

Reference is made to FIG. 1, which shows a schematic view of a vehicle 2 with driving dynamics regulation known per se. Details in respect of this driving dynamics regulation can be found, for example, in DE 10 2011 080 789 A1, which is incorporated by reference.

The vehicle 2 comprises a chassis 4 and four wheels 6. Each wheel 6 can be slowed down with respect to the chasses 4 via a brake 8 fixed in position on the chassis 4 in order to slow down a movement of the vehicle 2 on a road (not illustrated).

In this case, it may arise, in a manner known to a person skilled in the art, that the wheels 6 of the vehicle 2 loose traction and the vehicle 2 even moves away from a trajectory preset, for example, via a steering wheel (not shown) by understeering or oversteering. This is avoided by control loops known per se such as ABS (anti-lock braking system) and ESP (electronic stability program).

In the present embodiment, the vehicle 2 has speed sensors 10 on the wheels 6 for this purpose, which speed sensors detect a speed 12 of the wheels 6. In addition, the vehicle 2 has an inertial sensor 14, which detects driving dynamics data 16 of the vehicle 2, from which, for example, a pitch rate, a roll rate, a yaw rate, a lateral acceleration, a longitudinal acceleration and/or a vertical acceleration can be derived in a manner known per se to a person skilled in the art.

On the basis of the detected speeds 12 and driving dynamics data 16, a controller 18 can determine, in a manner known to a person skilled in the art, whether the vehicle 2 is skidding on the roadway or is even deviating from the abovementioned preset trajectory and whether to respond to this correspondingly with a controller output signal 20 known per se. The controller output signal 20 can then be used by an actuating device 22 to actuate actuating elements, such as the brakes 8, by means of actuating signals 24, which actuating elements respond to the skidding and to the deviation from the preset trajectory in a manner known per se.

The controller 18 can be integrated in an engine control system of the vehicle 2 known per se. The controller 18 and the actuating device 22 can also be in the form of a common regulation device and optionally integrated in the abovementioned engine control system.

The inertial sensor 14 shown in FIG. 1 is intended to illustrate in more detail the present invention even if the present invention is implementable using any desired electronic apparatuses and in particular any desired sensors, such as magnetic field sensors, acceleration sensors, speed sensors, structure-borne noise sensors or temperature sensors.

Figure 2:
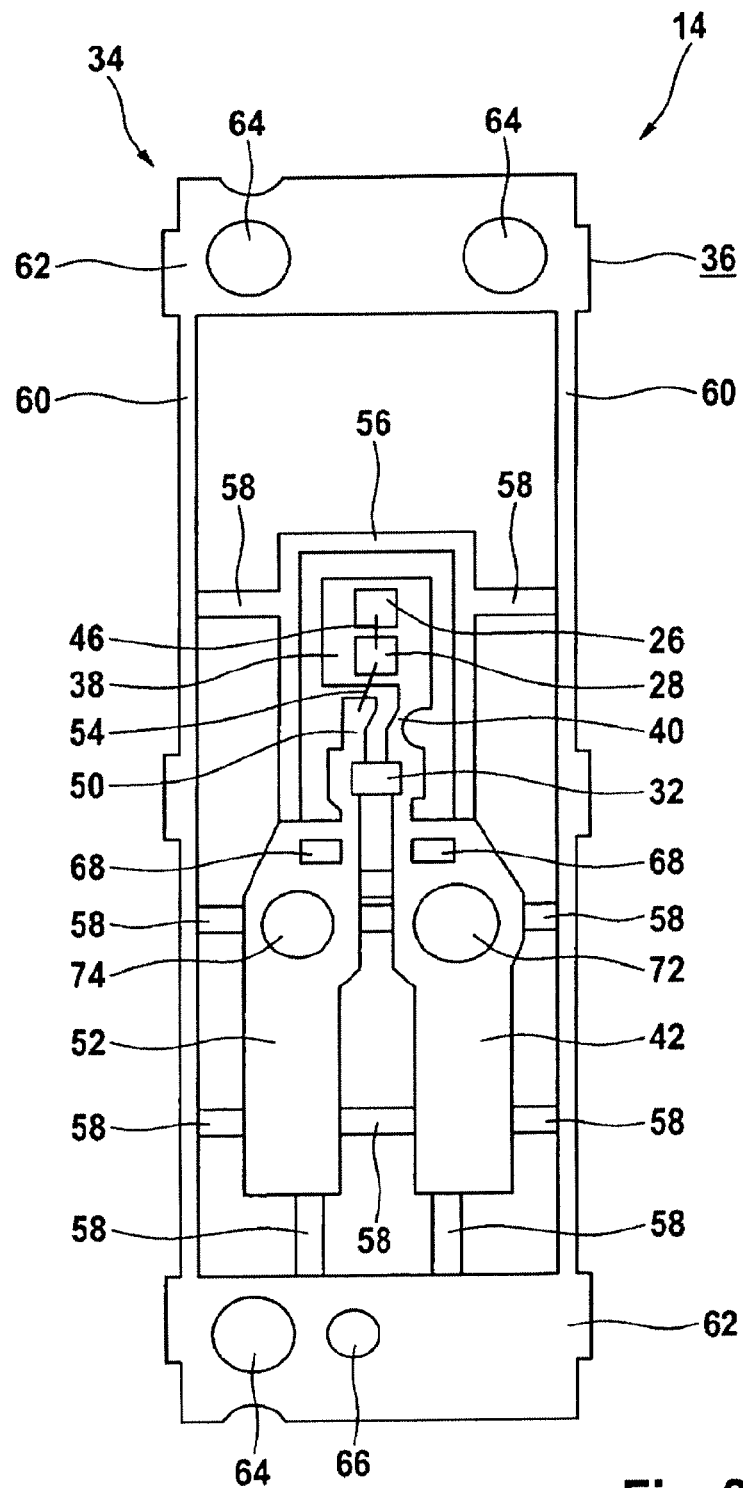
FIG. 2 shows a schematic illustration of an inertial sensor for driving dynamics regulation in a first production state.

Reference is made to FIG. 2, which shows a schematic illustration of the inertial sensor 14 for driving dynamics regulation in a first production state.

Figure 4:
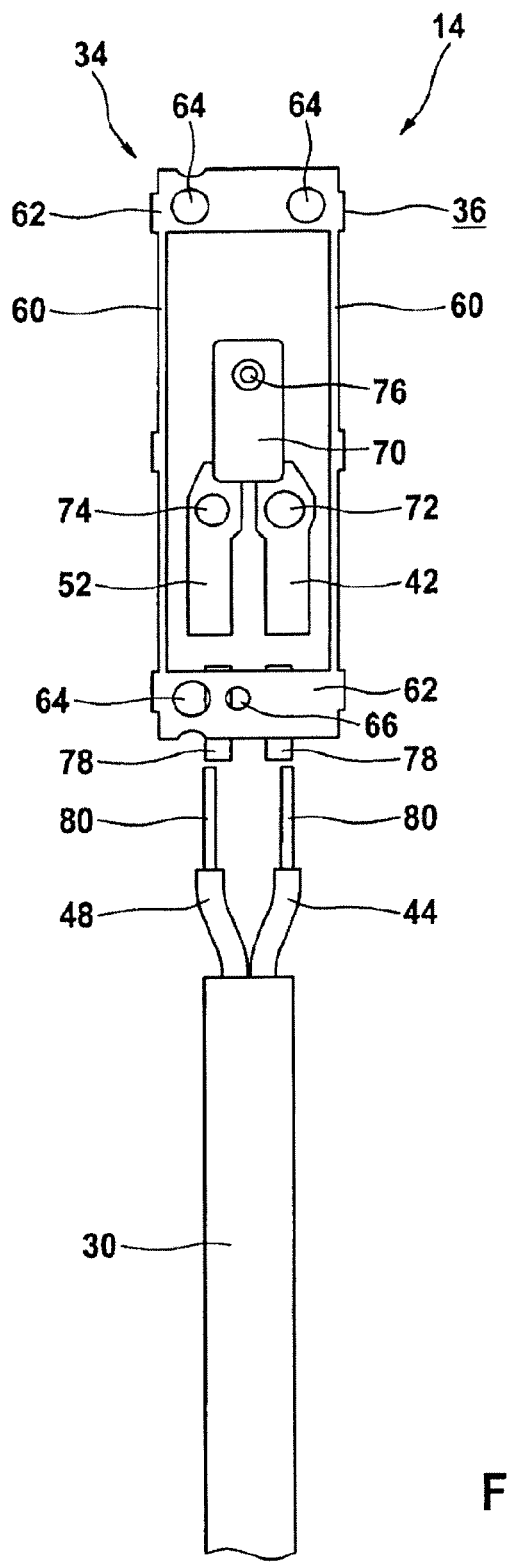
FIG. 4 shows a schematic illustration of the inertial sensor for driving dynamics regulation in a third production state.

The inertial sensor 14 comprises at least one microelectromechanical system 26, referred to as MEMS 26, as measuring pickup, which in a manner known per se outputs a signal (not illustrated) which is dependent on the driving dynamics data 16 to a signal evaluation circuit 28 in the form of an application-specific integrated circuit 28, referred to as ASIC 28. The ASIC 28 can then generate the driving dynamics data 16 on the basis of the received signal, which is dependent on the driving dynamics data 16, and the driving dynamics data can then be filtered by a filter capacitor 32, for example prior to being fed into a data cable 30 transmitting the driving dynamics data 16. The data cable 30 is illustrated in FIG. 4, for example.

In the present embodiment, the MEMS 26, the ASIC 28, the data cable 30 and the filter capacitor 32 are wired to one another via a wiring device 34. In order to produce the wiring device 34, first a punched grid 36 is formed by punching. The punched grid 36 comprises a multiplicity of wiring devices 34 arranged next to one another in a row, wherein only one wiring device 34 thereof is illustrated in FIG. 2 for reasons of clarity.

Each wiring device 34 in this case has a placement island 38, on which the MEMS 26 and the ASIC 28 are positioned and electrical contact is made therewith. This can be performed, for example, by soldering or adhesive-bonding techniques. The placement island 38 is connected to a first interface 42, commonly known as outer lead, via a first conductor track 40, commonly known as inner lead. A transmission line 44 (illustrated in FIG. 4) of the data cable 30 can be connected to this first outer lead 42. A further electrical connection between the MEMS 26 and the ASIC 28 is produced via a first bonding wire 46.

In order to tie the inertial sensor 14 to a grounding line 48 (illustrated in FIG. 4) of the data cable 30, each wiring device 34 has a second conductor track 50, commonly known as inner lead, which conductor tracks are connected to a second interface 52, commonly known as outer lead. The second outer lead 52 is connected to the grounding line 48 of the cable. Electrical contact is made between the ASIC 28 and the second inner lead 50 via a second bonding wire 54.

The placement of the wiring device 34 with the MEMS 26, the ASIC 28, the data cable 30 and the filter capacitor 32 can be performed, for example, by adhesive bonding or soldering, with the result that, at the same time as the placement process, the electrical connection to the wiring device 34 is produced. Then, the bonding wires 46, 54 are bonded in the abovementioned way.

During the bonding process, the partners to be connected to one another, i.e. for example the ASIC 28 and the first bonding wire 46, are brought into a state with respect to one another in which materials of these elements can fuse with one another or enter into a metallic connection. In this case, the application of mechanical pressures is also required. In order to withstand these mechanical pressures, the leads 40, 42, 50, 52 and the placement island 38 are held mechanically on leadframes 60 via a so-called dambar 56 and web elements 58. In this case, however, in contrast to conventional solutions, no web elements 58 are arranged between the inner leads 40, 50, the placement island 38 and the dambar 56.

The leadframes 60 are held on transportation frames 62, in which transportation openings 64 are formed for mechanically transporting the wiring devices 34 arranged next to one another in a row during production of the inertial sensor 14. In addition, coding openings 66 can also be provided, on the basis of which, for example, an advance of the wiring devices 34 can be controlled.

In the region of the point of connection between the inner leads 40, 50 and the outer leads 42, 52, in the present embodiment anchoring openings 68 passed through the punched grid 36 are formed, on which a circuit housing 70 (yet to be described and shown in FIG. 3) can be anchored.

In addition, a first holding opening 72 and a second holding opening 74 are formed in the outer leads 42, 52 behind the anchoring openings 68, when viewed from the inner leads 40, 50, and a tool (not illustrated) which is suitable for producing a molding compound 77 (yet to be described and shown in FIG. 6) can engage in said holding openings. The two holding openings 72 and 74 at the same time act also as anchoring openings in the molding compound. They also act as abutments for forces which are introduced via the data cable 30 by means of thermal loading or mechanical force introduction. A force introduction into the inertial sensor 14 and therefore shear stress on the compound structure between the circuit housing 70 and the wiring device 34 is thus largely suppressed. The configuration of the holding openings 72, 74 should cover the thermal expansion of the outer leads 42, 52 with at the same time a high degree in positioning accuracy and protect against rotation of the inertial sensor 14 (poka yoke). For this purpose, the holding openings 72, 74 in the present embodiment have different sizes. However, they can also be in the form of a pairing consisting of a slot and a round hole, for example. Instead of a slot/round hole, other anchoring structures are also possible, such as T shapes, for example.

The placement island 38 is fastened on the first outer lead 42 via the first inner lead 40. In the case of the abovementioned bonding, the placement island 38 can thus yield and therefore bend owing to the lack of web elements 58 between the first inner lead 40 and the placement island 38 and the dambar 56 as a result of the lever forces occurring. These lever forces are largely kept low because the dambar 56 itself is held on the leadframes 60 via web elements 58. In the case of bonding of the punched frame 36, there could also be heating in particular in the region of the placement island 38 and the first inner lead 40 in order to reduce the mechanical forces required for bonding. Optimally, however, the modulus of elasticity of the first inner lead 40 is selected such that bending of the inner lead 40 during bonding does not result in any plastic deformation. For this purpose, the material and/or the geometry of the first inner lead 40 can be matched correspondingly.

Figure 3:
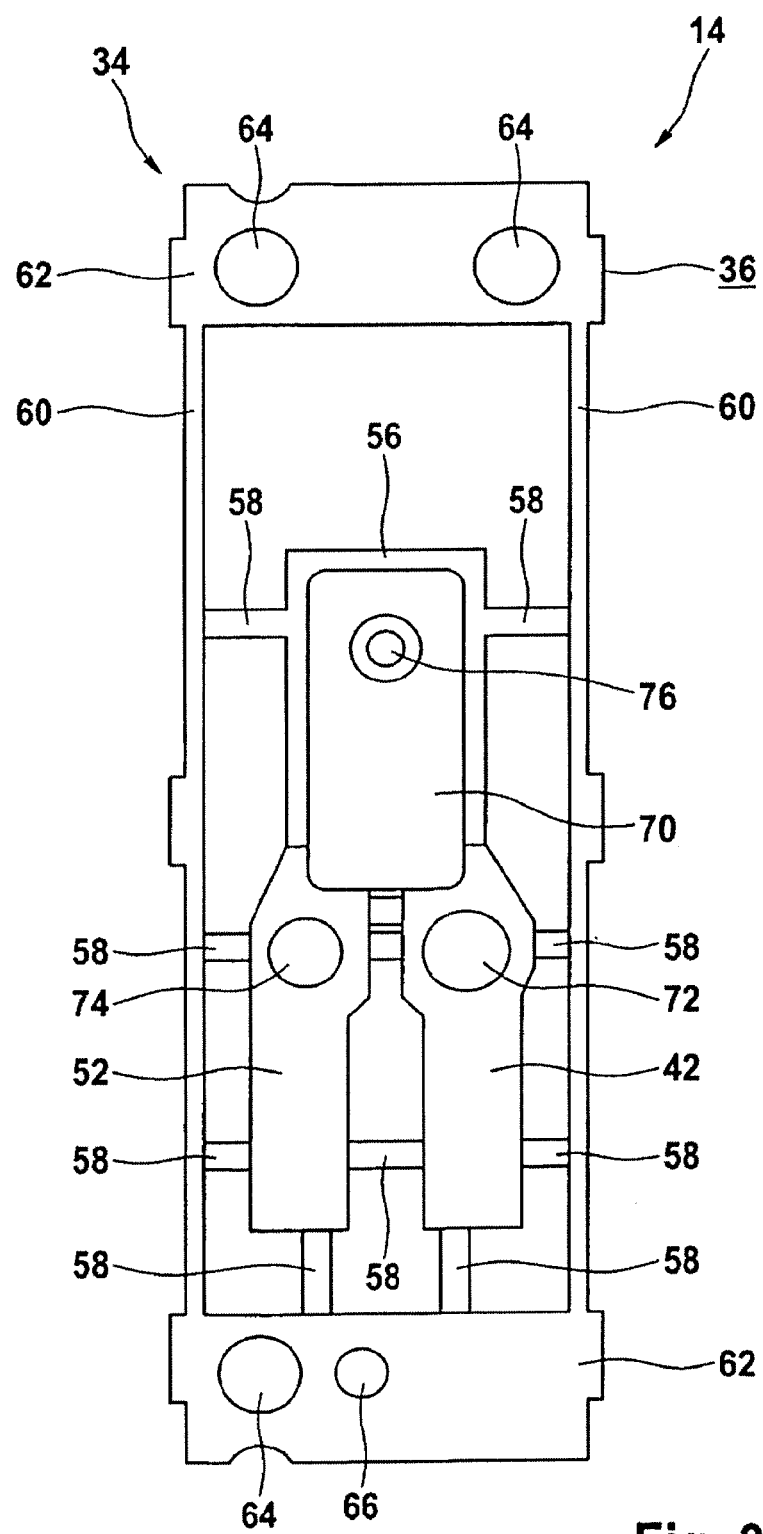
FIG. 3 shows a schematic illustration of the inertial sensor for driving dynamics regulation in a second production state.

Reference is made to FIG. 3, which is a schematic illustration of the inertial sensor 14 for driving dynamics regulation in a second production state.

In this production state, the wiring device 34 is housed by the circuit housing 70 in the region of the MEMS 26, the ASIC 28, the data cable 30 and the filter capacitor 32 as far as the anchoring openings 68. The circuit housing 70 in the present embodiment is formed from a thermosetting plastic material and is cast around the abovementioned elements.

A depression 76, for example in the form of a blind hole, can be formed on the circuit housing 70 in the region of the MEMS 26, the placement island 38 or the inner lead 40. This depression 76 or an elevation can also be used for fixing and adjustment in a tool for applying the molding compound 77 and can be formed on the side shown of the circuit housing 70 and/or on the side opposite this side. The arrangement of the MEMS 26 over the depression 76 enables the production of an air gap with very narrow tolerances, with the result that the inertial sensor 14 can be used in the installed position of the application with an air gap with very narrow tolerances.

Reference is made FIG. 4, which shows a schematic illustration of the inertial sensor 14 for driving dynamics regulation in a third production state.

In this production state, the web elements 58 and the dambar 56 have been removed from the wiring device 34. Litz wire eyelets 78 are applied to the lower transportation frame 62, and cable litz wires 80 of the sensor line 44 and the grounding line 48 are inserted into said litz wire eyelets. The fastening of the litz wire eyelets 78 on the transportation frame 62 provides a stable hold during insertion of the cable litz wires 80 into said litz wire eyelets.

Figure 5:
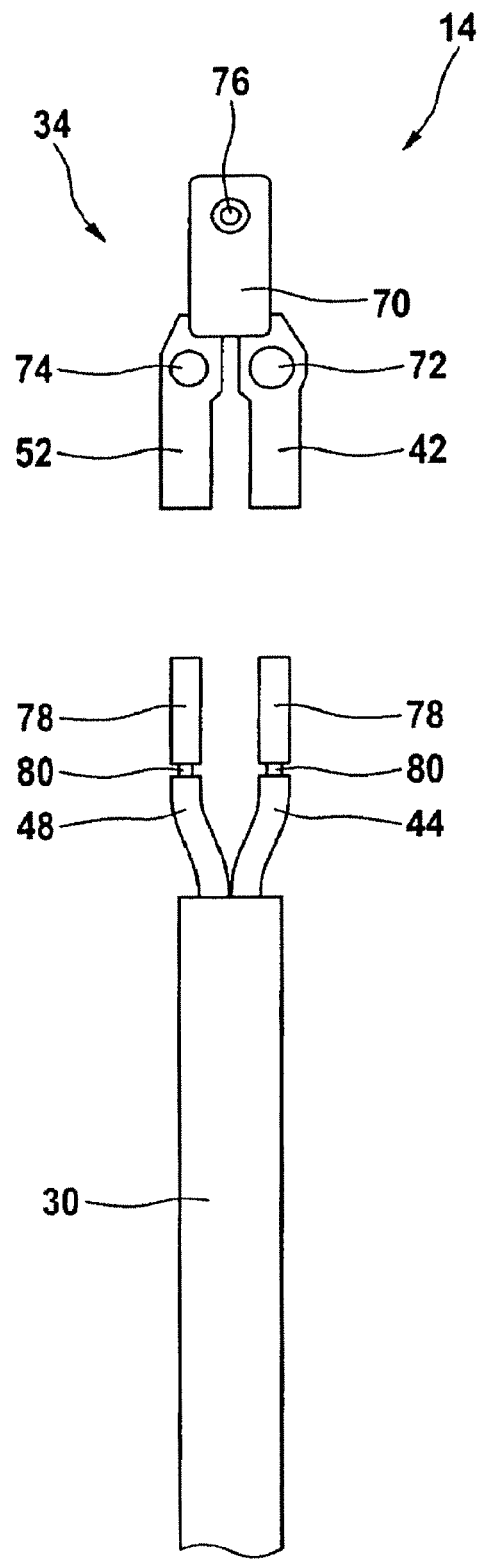
FIG. 5 shows a schematic illustration of the inertial sensor for driving dynamics regulation in a fourth production state.

Reference is made to FIG. 5, which shows a schematic illustration of the inertial sensor 14 for driving dynamics regulation in a fourth production state.

In this production state, the transportation frames 62 and the leadframes 60 have been removed so that contact can be made with the litz wire eyelets at the outer leads 42, 52. The contact can be made in this case as desired by means of crimping, splicing, welding, plugging, adhesive bonding or soldering, for example.

Figure 6:
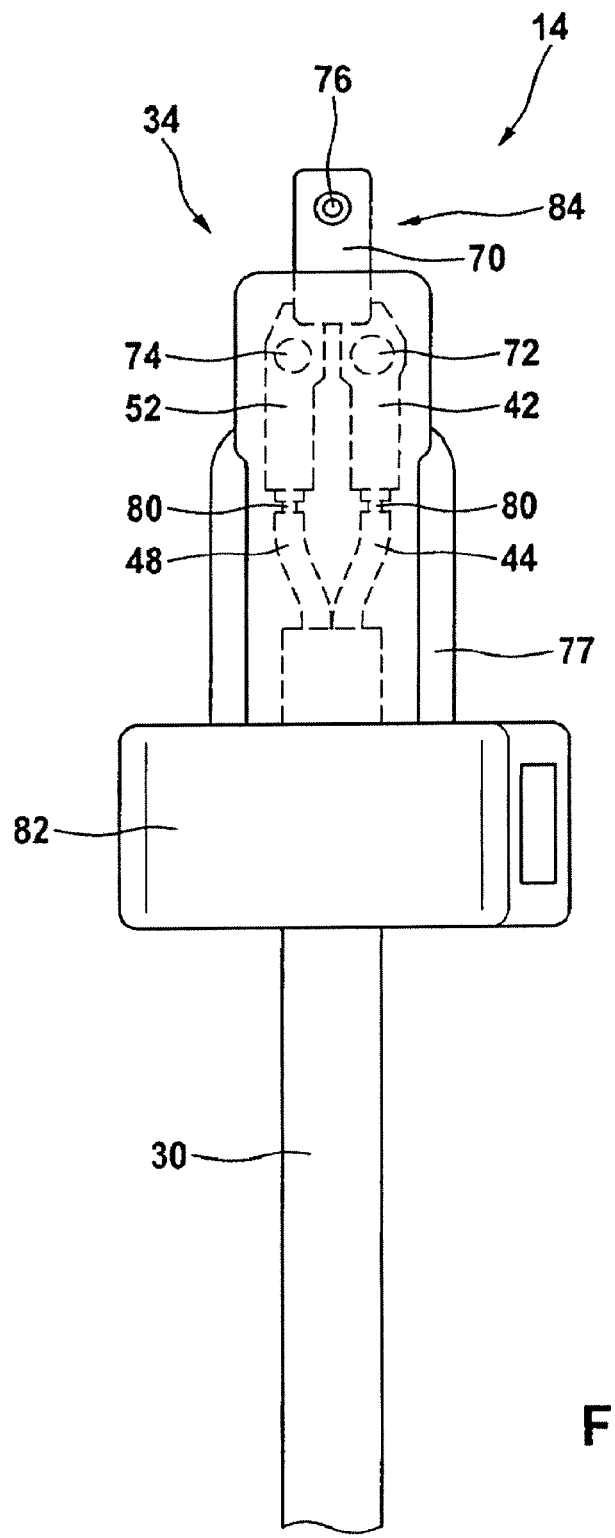
FIG. 6 shows a schematic illustration of the finished inertial sensor for driving dynamics regulation.

Reference is made to FIG. 6, which shows a schematic illustration of the finished inertial sensor 14 for driving dynamics regulation.

In order to finish the inertial sensor 14, part of the circuit housing 70, the outer leads 42, 52 and part of the data cable 30 are encapsulated by injection molding with the abovementioned molding compound 77. A holding element 82 can be provided which can be fastened, for example, on a housing (not illustrated) of the end application, i.e. the vehicle 2, for fixing the inertial sensor 14.

The encapsulation by injection molding with the molding compound of the inertial sensor 14 can be performed in this case in such a way that an exposed region 84 on the circuit housing 70 remains, in which region in particular the depression 76 should be formed in order not to pose a risk to the narrow tolerances of the abovementioned air gap. The exposed region can in particular remain because no web elements 58 were provided between the dambar 56 and the placement island 38 or the inner leads 40, 50 during production of the circuit housing 70 which could contribute to a formation of a gap and therefore to the ingress of moisture. Without the web elements 58, therefore, the tolerance of the inertial sensor 14 can be noticeably increased. If the inertial sensor 14 is in the form of a magnetic field or temperature sensor, the effect of the air gap with narrow tolerances is even more pronounced.

The surface of the circuit housing 70 can in this case be activated, at least regionally, prior to the encapsulation by injection molding with the molding compound 77. Activation of the surface of the circuit housing 70 should be understood below to mean partial destruction of the molecular structure of the surface of the circuit housing 70 so that free radicals are produced on the surface of the circuit housing 70. These free radicals are capable of entering into chemical and/or physical bonds with the molding compound 77, with the result that they can no longer become detached from the surface of the circuit housing 70. In this way, the molding compound 77 is fixedly fixed on the circuit housing 70.

The molding compound 77 can in this case comprise a thermoplastic or thermosetting plastic. Particularly preferably, the molding compound 77 comprises a polar material, such as polyamide. The polar polyamide can be bonded physically to the activated surface of the circuit housing 70 in a manner known to a person skilled in the art and can thus be fixed fixedly on the circuit housing. Further bonds which have a polar surface in the molten state of the molding compound 77 and thus bond with the activated surface of the circuit housing 70 are possible.

This bond that has been produced is maintained after solidification of the molten molding compound 77.

Part of the surface of the circuit housing 70 in the contact region with the molding compound 77 can in this case alternatively or additionally be roughened such that the effective activated surface area is enlarged and the adhesive effect brought about in particular by the activation between the circuit housing 70 and the molding compound 77 is increased.

The roughened part of the surface of the circuit housing 70 could be roughened by a laser. By means of the laser, the surface of the circuit housing 70 can be not only activated but also any existing releasing agents which could suppress adhesion between the circuit housing 70 and the molding compound 77 are removed from the surface of the circuit housing 70 by the laser. In addition, the laser can also at the same time be used for establishing a feature characterizing the inertial sensor 14, such as, for example, a serial number or a data matrix code known per se with the serial number.

Alternatively, the laser can also be used merely for roughening the surface, however. The activation can then be performed using a plasma, for example.

In the same way, the data cable 30 and the other components of the inertial sensor 14 to be encapsulated by injection molding can also be treated prior to the encapsulation by injection molding.

The encapsulation by injection molding of the inertial sensor 14 with the molding compound 77 can be performed using any desired injection molding process, such as RIM (Reaction Injection Molding), transfer molding or casting.

Figure 7:
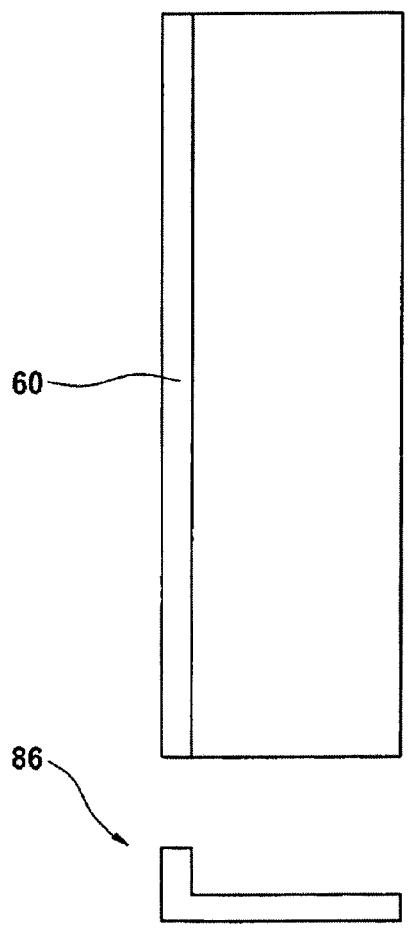
FIG. 7 shows a cross-sectional illustration of a possible embodiment of a leadframe used in the production of the inertial sensor.
Figure 8:
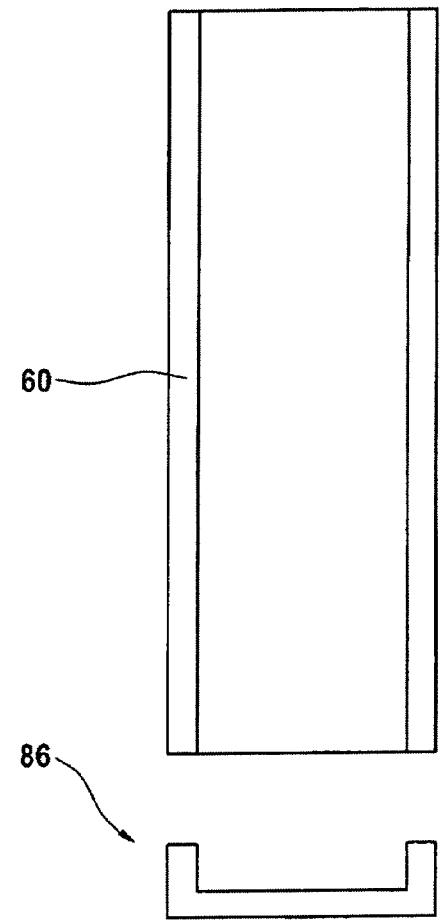
FIG. 8 shows a cross-sectional illustration of an alternative embodiment of a leadframe used in the production of the inertial sensor.

In FIGS. 7 and 8, two possible cross sections 86 for the leadframes 60 in FIGS. 2 to 4 are shown. These cross sections 86 deviate from a sheet-like profile and therefore reinforce the wiring device 34 further in particular during the abovementioned bonding. The other elements of the wiring device 34 could also be provided with this cross section 86.

The invention claimed is:

1. A wiring device for wiring an electronic apparatus comprising an interface, a conductor track, a placement island, and a leadframe enclosing the interface, the conductor track, and the placement island, wherein the placement island is connected to the interface via the conductor track, the placement island including a surface adapted to be electrically bonded to an electronic component and being adapted to make electrical contact with the interface via the electrical conductor track, wherein the placement island is free from a web element which connects between the placement island and the leadframe, and which is designed to hold the placement island on a supporting element during a housing process for housing the placement island.

2. The wiring device as claimed in claim 1, wherein the conductor track has a modulus of elasticity which is dimensioned such that bending of the conductor track once the electronic component has been placed on the placement island remains within a predetermined limitation.

3. The wiring device as claimed in claim 1, comprising the supporting element, which is connected to the leadframe via a web element.

4. The wiring device as claimed in claim 3, wherein the leadframe has a contour in its cross section which deviates from a sheet-shaped profile.

5. The wiring device as claimed in claim 1, wherein the leadframe has a contour in its cross section which deviates from a sheet-shaped profile.

6. An electronic apparatus comprising a wiring device as claimed in claim 1, an electronic component which is carried by the placement island and is in electrical contact with the interface via the electrical conductor track, and a circuit housing, which houses at least the placement island and the electronic component.

7. The electronic apparatus as claimed in claim 6, comprising a molding compound which partially houses the circuit housing, wherein the circuit housing protrudes out of the molding compound at least in the region of the placement island.

8. The electronic apparatus as claimed in claim 7, which electronic apparatus is designed, as sensor, to output, with the electronic component, an electrical signal based on a detected physical variable.

9. The electronic apparatus as claimed in claim 6, which electronic apparatus is designed, as sensor, to output, with the electronic component, an electrical signal based on a detected physical variable.

10. A method for producing an electronic apparatus, comprising:
   placing the electronic component on the placement island of a wiring device as claimed in claim 1, and
   housing at least the placement island in a circuit housing.

11. The method as claimed in claim 10, wherein at least part of the wiring device is heated to a predetermined temperature during placement on the placement island.

* * * * *